(12) United States Patent
Koganei

(10) Patent No.: US 8,839,070 B2
(45) Date of Patent: Sep. 16, 2014

(54) ERROR CORRECTION APPARATUS AND ERROR CORRECTION METHOD

(75) Inventor: Yohei Koganei, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 154 days.

(21) Appl. No.: 13/404,363

(22) Filed: Feb. 24, 2012

(65) Prior Publication Data

US 2012/0254702 A1 Oct. 4, 2012

(30) Foreign Application Priority Data

Mar. 28, 2011 (JP) ................................. 2011-071193

(51) Int. Cl.
| | |
|---|---|
| *H03M 13/00* | (2006.01) |
| *H03M 13/29* | (2006.01) |
| *H04L 1/20* | (2006.01) |
| *H03M 13/45* | (2006.01) |
| *H04L 1/00* | (2006.01) |
| *H03M 13/15* | (2006.01) |

(52) U.S. Cl.
CPC ...... *H03M 13/2906* (2013.01); *H03M 13/2948* (2013.01); *H04L 1/201* (2013.01); *H03M 13/2951* (2013.01); *H03M 13/458* (2013.01); *H04L 1/0046* (2013.01); *H04L 1/0057* (2013.01); *H03M 13/2909* (2013.01); *H03M 13/152* (2013.01); *H03M 13/2927* (2013.01)
USPC ........................................................ 714/760

(58) Field of Classification Search
None
See application file for complete search history.

(56) References Cited

U.S. PATENT DOCUMENTS

| | | | | |
|---|---|---|---|---|
| 5,091,955 | A | * | 2/1992 | Iseda et al. ..................... 704/230 |
| 6,480,976 | B1 | * | 11/2002 | Pan et al. ........................ 714/701 |
| 6,665,831 | B1 | * | 12/2003 | Yoshida et al. ................. 714/774 |
| 6,920,600 | B2 | * | 7/2005 | Litwin et al. ................... 714/784 |
| 2007/0124657 | A1 | | 5/2007 | Orio |
| 2008/0294967 | A1 | * | 11/2008 | Tomlinson et al. ............ 714/800 |
| 2009/0228756 | A1 | * | 9/2009 | Cookman et al. .............. 714/752 |

FOREIGN PATENT DOCUMENTS

| | | |
|---|---|---|
| EP | 1009123 | 6/2000 |
| JP | 05-298837 | 11/1993 |
| JP | 10-229343 | 8/1998 |
| JP | 2000-174638 | 6/2000 |
| JP | 2002-043952 | 2/2002 |
| JP | 2004-215240 | 7/2004 |
| JP | 2007-142622 | 6/2007 |
| JP | 4202161 | 12/2008 |
| JP | 2009-200732 | 9/2009 |

OTHER PUBLICATIONS

International Telecommunication Union, "Series G: Transmission Systems and Media Digital Systems and Networks—Forward error correction for submarine systems" ITU-T, G.975 (Oct. 2000).

(Continued)

*Primary Examiner* — Daniel McMahon
(74) *Attorney, Agent, or Firm* — Staas & Halsey LLP

(57) ABSTRACT

A plurality of error correction circuits connected in series include a calculator circuit that corrects the codeword when the determination results of a determination circuit indicate that the error correction circuit at the present stage is to correct the codeword, and a determination circuit at a subsequent error correction apparatus determines whether the error correction circuit at the subsequent stage is to correct the codeword when the determination results of the determination circuit indicate that the error correction circuit at the present stage is not to correct the codeword.

4 Claims, 9 Drawing Sheets

(56) References Cited

OTHER PUBLICATIONS

International Telecommunication Union, "Series G: Transmission Systems and Media Digital Systems and Networks—Forward error correction for high bit-rate DWDM submarine systems" ITU-T, G.975.1 (Feb. 2004).

International Telecommunication Union, "Series G: Transmission Systems and Media Digital Systems and Networks—Interfaces for the Optical Transport Network (OTN)" ITU-T, G.709/Y.1331 (Dec. 2009).

Office Action issued in copending Japanese Patent Application No. 2011-071193 on May 20, 2014.

\* cited by examiner

FIG. 7

| ORDER OF ERROR POLYNOMIAL | NUMBER OF ROOTS OF ERROR POLYNOMIAL | COMPARISON WITH INTERSECTING CODEWORD | CALCULATED VALUE (RELIABILITY) (0: GOOD - 5: BAD) |
|---|---|---|---|
| T OR BELOW | EQUAL TO ORDER OF POLYNOMIAL | MATCHING CORRECTION LOCATIONS BEING PRESENT | 0 |
| T-1 OR BELOW | EQUAL TO ORDER OF POLYNOMIAL | NO MATCHING CORRECTION LOCATIONS. AMONG CODEWORDS INTERSECTING AT CORRECTION LOCATION, ONLY ONE HAVING LOWEST ORDER OF ERROR POLYNOMIAL | 1 |
| T | EQUAL TO ORDER OF POLYNOMIAL | NO MATCHING CORRECTION LOCATIONS. AMONG CODEWORDS INTERSECTING AT CORRECTION LOCATION, ONLY ONE HAVING LOWEST ORDER OF ERROR POLYNOMIAL | 2 |
| T OR BELOW | EQUAL TO ORDER OF POLYNOMIAL | NO MATCHING CORRECTION LOCATIONS. AMONG CODEWORDS INTERSECTING AT CORRECTION LOCATION, ONE HAVING LOWEST ORDER OF ERROR POLYNOMIAL | 3 |
| T OR BELOW | EQUAL TO ORDER OF POLYNOMIAL | NO MATCHING CORRECTION LOCATIONS. AMONG CODEWORDS INTERSECTING AT CORRECTION LOCATION, ONE NOT HAVING LOWEST ORDER OF ERROR POLYNOMIAL | 4 |
| T OR BELOW | NOT EQUAL TO ORDER OF POLYNOMIAL | NOT ACCOUNTED FOR | 5 |

FIG. 8

| ERROR CORRECTION CIRCUIT | FIRST STAGE | SECOND STAGE | THIRD STAGE | FOURTH STAGE | FIFTH STAGE | SIXTH STAGE |
|---|---|---|---|---|---|---|
| FIX | 0 | 0~1 | 0~2 | 0~3 | 0~3 | 0~3 |
| TRY | 1 | 2 | 3 | 4 | 4 | — |
| PASS | 2~5 | 3~5 | 4~5 | 5 | 5 | 5 |
| RESET | — | PRECEDING STAGE≠1 | PRECEDING STAGE≠2 | PRECEDING STAGE≠3 | PRECEDING STAGE≠4 | PRECEDING STAGE≠4 |
| INFORMATION KEEP | — | — | — | — | — | — |
| UNDO | — | PRECEDING STAGE=1 | PRECEDING STAGE=2 | PRECEDING STAGE=3 | PRECEDING STAGE=4 | PRECEDING STAGE=4 |

ERROR CORRECTION APPARATUS AND ERROR CORRECTION METHOD

CROSS-REFERENCE TO RELATED APPLICATION(S)

This application is based upon and claims the benefit of priority of the prior Japanese Patent Application No. 2011-71193, filed on Mar. 28, 2011, the entire contents of which are incorporated herein by reference.

FIELD

The embodiments discussed herein are related to an error correction apparatus, and an error correction method.

BACKGROUND

Optical transport network (OTN) is available as one of the optical transmission techniques. OTN is being standardized by International Telecommunication Union-Telecommunication sector (ITU-T) and Institute of Electrical and Electronic Engineers (IEEE). OTN is described in ITU-T G.709/Y. 1331 (12/2009), "*Interfaces for the Optical Transport Network (OTN)*".

Reed-Solomon code RS (255, 239) is standardized in an error correction system of OTUk(V) layer of OTN. The error correction scheme of RS (255, 239) is described in ITU-T G.975(10/2000), "*Forward error correction for submarine systems.*"

As communication traffic volume increases, high-speed, long-distance, and low-cost communication designs of networks are promoted. Performance increase in the error correction technique is desired. A technique described in ITU-T G. 975.1 provides an improved mapping method by combining types of and concatenations of codes and is expected to outperform RS (255, 239). OTUk stands for "optical channel transport unit-k".

One error correction apparatus estimates an error location of a second data packet received subsequent to a first data packet, based on error correction information of the first data packet having undergone an error correction operation. One decoder apparatus partitions received data into block segments and repeats on each block segment a coding stop determination operation as to whether to stop decoding on the block segment, and determines based on the results of the coding stop determination operation that a decoding operation of the received data is to stop. Another error correction decoder apparatus repeats convolutional decoding in a first decoder using decoding results of a second decoder as syndrome-based prior probability series.

Related art is disclosed in Japanese Laid-open Patent Publication No. 2004-215240, Japanese Laid-open Patent Publication No. 2007-142622, and Japanese Laid-open Patent Publication No. 2009-200732.

SUMMARY

According to an aspect of the invention, an error correction apparatus including a plurality error correction circuits connected with series, each of the error correction circuits includes a calculator circuit that calculates a reliability of a codeword indicating a probability of occurrence of a correction error of the codeword, a determining circuit that compares the reliability calculated by the calculator circuit with a threshold value, and determines in accordance with the comparison results whether the error corrector at a present stage is to correct the codeword, and a corrector circuit that corrects the codeword in accordance with the determination results of the determining circuit, wherein each of the correctors circuit corrects the codeword when the determination results of the determining circuit indicate that the error correcting circuit at the present stage is to correct the codeword, and the determining circuit at a subsequent error correction apparatus determines whether the error correcting circuit at the subsequent stage is to correct the codeword when the determination results of the determining circuit indicate that the error correcting circuit at the present stage is not to correct the codeword.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 illustrates a calculation example of the reliability of the error correction apparatus of the second embodiment;

FIG. 8 illustrates an example of a threshold value in the error correction apparatus of the second embodiment.

DESCRIPTION OF EMBODIMENTS

Figure 1:
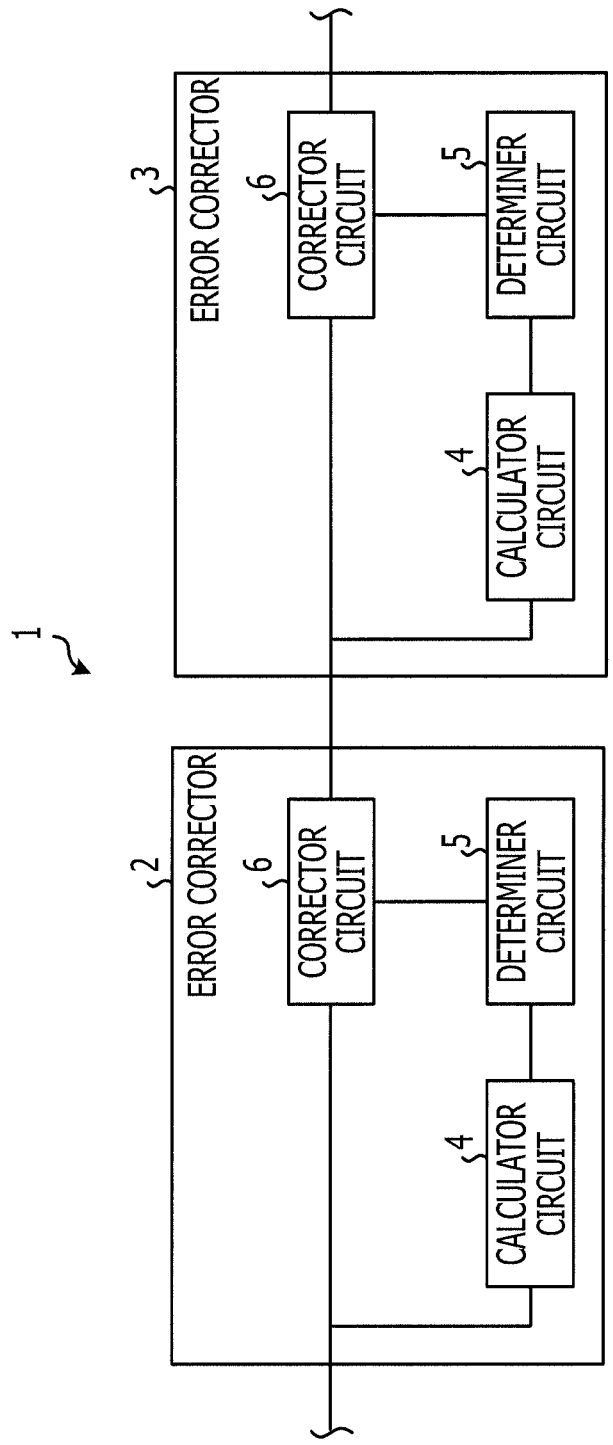
FIG. 1 is a block diagram illustrating an error correction apparatus of a first embodiment.

The embodiments of an error correction apparatus and an error correction method are described in detail with reference to the drawings. According to the error correction apparatus and the error correction method, reliability of a codeword is calculated at each error correction stage, the reliability of each codeword is compared with a threshold value, a determination as to whether to correct the codeword is made at each error correction stage depending on comparison results of the reliability with the threshold value, and a determination as to whether to correct a codeword not corrected at a prior stage is redone at a subsequent stage. This series of operations is repeated. In the discussion that follows, the error correction apparatus and the error correction method are applied to an error correction technique of concatenated decoding of hard decision. In the discussion of each embodiment, like elements are identified with like reference numerals and the discussion thereof is not repeated.

FIG. 1 is a block diagram illustrating an error correction apparatus 1 of a first embodiment. As illustrated in FIG. 1, the error correction apparatus 1 includes a plurality of error correctors, i.e., error correctors 2 and 3. Each of the error correctors 2 and 3 at respective stages include calculator circuit 4, determiner circuit 5, and corrector circuit 6.

The calculator circuit 4 in the error corrector 2 is coupled to the circuit at a more preceding stage (not illustrated). The determiner circuit 5 in the error corrector 2 at the preceding stage is coupled to the calculator circuit 4. The corrector circuit 6 in the error corrector 2 at the preceding stage is coupled to the circuit (not illustrated) at the more preceding stage, and also coupled to the determiner circuit 5 at the error corrector 2 at the preceding stage.

The calculator circuit 4 in the error corrector 3 at the subsequent stage is coupled to the corrector circuit 6 in the error corrector 2 at the preceding stage. The determiner circuit 5 in the error corrector 3 at the subsequent stage is coupled to the calculator circuit 4 in the error corrector 3 at the subsequent stage. The corrector circuit 6 in the error corrector 3 at the subsequent stage is coupled to the corrector circuit 6 in the error corrector 2 at the preceding stage and the determiner circuit 5 in the error corrector 3 at the subsequent stage. The corrector circuit 6 in the error corrector 3 at the subsequent stage is coupled to circuit (not illustrated) at a more subsequent stage.

Figure 2:
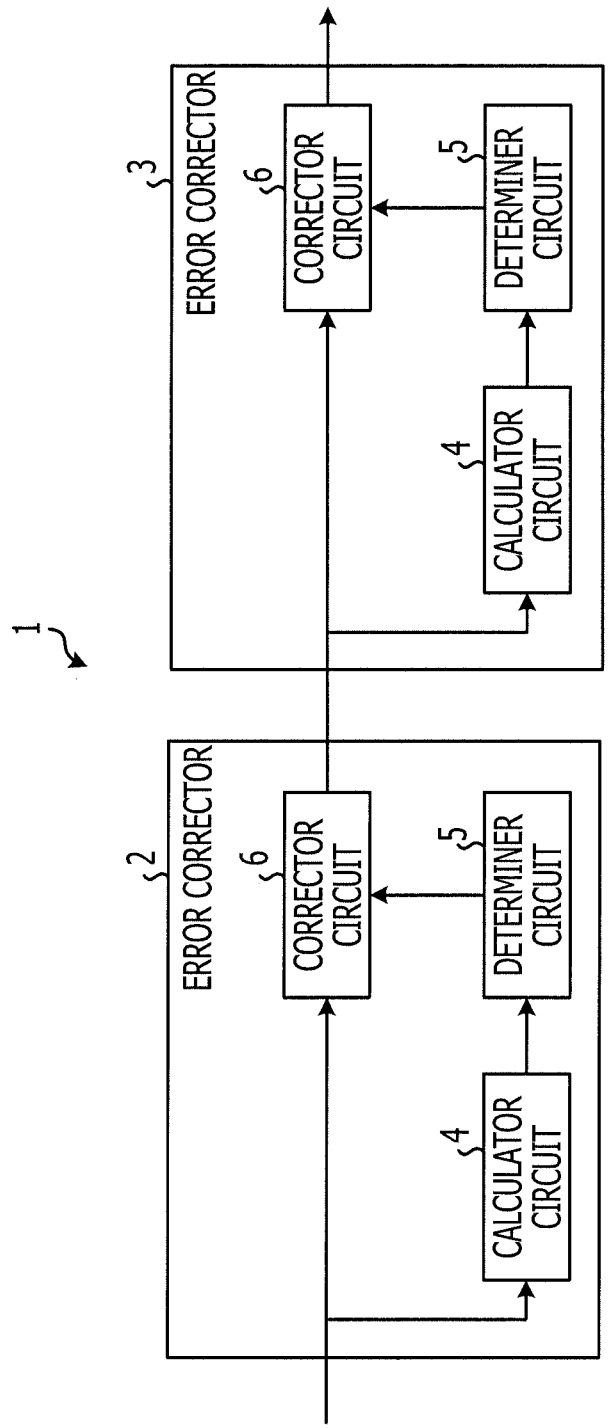
FIG. 2 is a block diagram illustrating a signal flow in the error correction apparatus of the first embodiment.

FIG. 2 is a block diagram illustrating a signal flow of the error correction apparatus 1 of the first embodiment. As illustrated in FIG. 2, the calculator circuit 4 in the error corrector 2 at the preceding stage calculates the reliability of a signal input from the more preceding circuit (not illustrated), i.e., the reliability of a codeword serving as a target signal of error correction. The reliability of the codeword is a measure indicating a probability of occurrence of a correction error of the codeword.

The determiner circuit 5 compares the reliability of the codeword calculated by the calculator circuit 4 with a threshold value, and determines, based on the comparison results, whether the codeword is to be corrected through the error corrector 2 at the present stage. The corrector circuit 6 then corrects the codeword depending on the determination results of the determiner circuit 5.

If the determination results of the determiner circuit 5 are that the codeword is to be corrected through the error corrector 2 at the present stage, the corrector circuit 6 corrects the codeword as an error correction target. If the determination results of the determiner circuit 5 are that the codeword is not to be corrected through the error corrector 2 at the present stage, the error corrector 3 at the subsequent stage redoes a determination operation as to whether to correct the codeword as the error correction target. The error corrector 3 at the subsequent stage performs the error correction operation as the error corrector 2 at the preceding stage.

According to the first embodiment, the determination operation as to whether to correct the codeword is repeated at the subsequent stage if the reliability of the codeword is low. Even if errors are included in a received signal, the generation of a correction error is controlled during a decoding operation. The error correction performance is thus increased.

In a second embodiment, the error correction apparatus and the error correction method of the first embodiment are applied to OTN. Alternatively, the error correction apparatus and the error correction method of the first embodiment may be applied to another field other than OTN.

Figure 3:
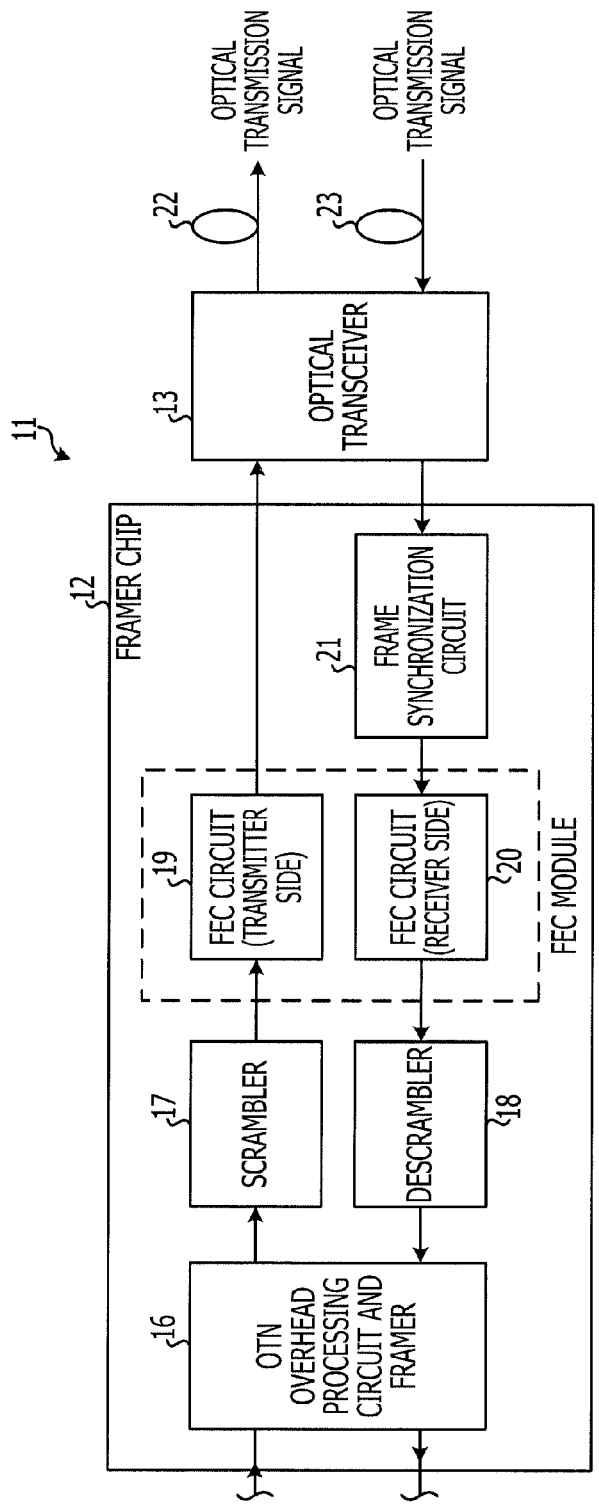
FIG. 3 is a block diagram illustrating an example of an optical transport apparatus as an application of an error correction apparatus of a second embodiment.

FIG. 3 is a block diagram illustrating an optical transport apparatus 11 of the second embodiment, to which the error correction apparatus of the first apparatus is applied. As illustrated in FIG. 3, the optical transport apparatus 11 includes a framer chip 12 and an optical transceiver 13.

The framer chip 12 performs a variety of processes, involving transmission and reception of data, and including a synchronization process, an error correction process, an encoding process, a decoding process, a frame conversion process, and an overhead process, each performed on transmission data and reception data. The framer chip 12 may be implemented as a programmable large scale integration (LSI), such as a field programmable gate array (FPGA), or application specific integrated circuit (ASIC).

The framer chip 12 may include OTN overhead processing circuit and framer 16, scrambler 17, descrambler 18, forward error correction (FEC) circuit 19 on a transmitter side, FEC circuit 20 on a receiver side as an error correction apparatus, and frame synchronization circuit 21. The FEC circuit 19 and the FEC circuit 20 may be modularized.

The OTN overhead processing circuit and framer 16 performs the frame conversion process and the overhead process on the transmission data output by an upper-layer application (not illustrated). The scrambler 17 performs an encryption process on the transmission data output by the OTN overhead processing circuit and framer 16. The FEC circuit 19 encodes the transmission data output by the scrambler 17 by attaching, to the transmission data, redundancy data (FEC parity) for use in error correction on the receiver side. The optical transceiver 13 converts an electrical signal (transmission signal) output by the FEC circuit 19 into an optical signal and then transmits the optical signal to an optical transport line 22.

The optical transceiver 13 converts the optical signal received via an optical transport line 23 into an electrical signal (reception signal), and outputs the received electrical signal to the framer chip 12. The frame synchronization circuit 21 performs the synchronization process on the received signal output by the optical transceiver 13. The FEC circuit 20 on the receiver side decodes the reception signal output from the frame synchronization circuit 21, thereby performing the error correction process. The descrambler 18 decrypts the encrypted reception data output from the FEC circuit 20 on the receiver side. The OTN overhead processing circuit and framer 16 performs the frame conversion process and the overhead process on the reception data output from the descrambler 18, and then outputs the processed data to an upper-layer application.

Figure 4:
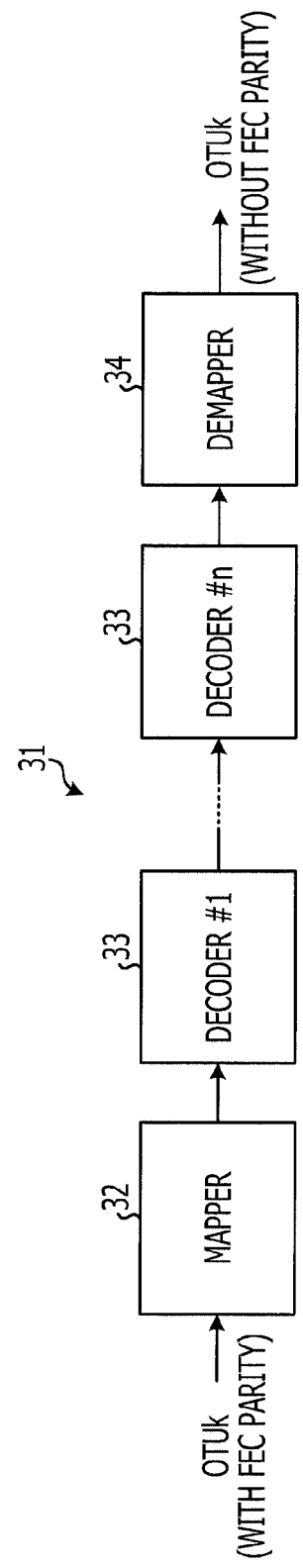
FIG. 4 is a block diagram illustrating the error correction apparatus of the second embodiment.

FIG. 4 is a block diagram illustrating the error correction apparatus 31 of the second embodiment. The error correction apparatus 31 of FIG. 4 is an example of the FEC circuit 20 on the receiver side in the optical transport apparatus 11 of FIG. 3. The error correction apparatus 31 may process an OTUk frame in OTN. As illustrated in FIG. 4, the error correction apparatus 31 includes a mapper 32, a plurality of decoders 33 as error correctors at a plurality of stages, and a demapper 34.

In accordance with a specified format, the mapper 32 performs a mapping conversion process on a signal in an OTUk frame having a FEC parity attached thereto. The plurality of decoders 33 decode a signal output by the mapper 32, thereby performing the error correction process repeatedly. The effect of iteration of error correction processes by the decoders 33 may gradually decrease. The number of iteration of error correction processes may be determined taking into consideration the balance between the number of times by which the advantage of the error correction processes levels off, and the circuit size of the error correction apparatus 31. The demapper 34 performs a demapping conversion process on a signal having iterated the error correction process, and thus outputs the OTUk frame signal without the FEC parity.

Figure 5:
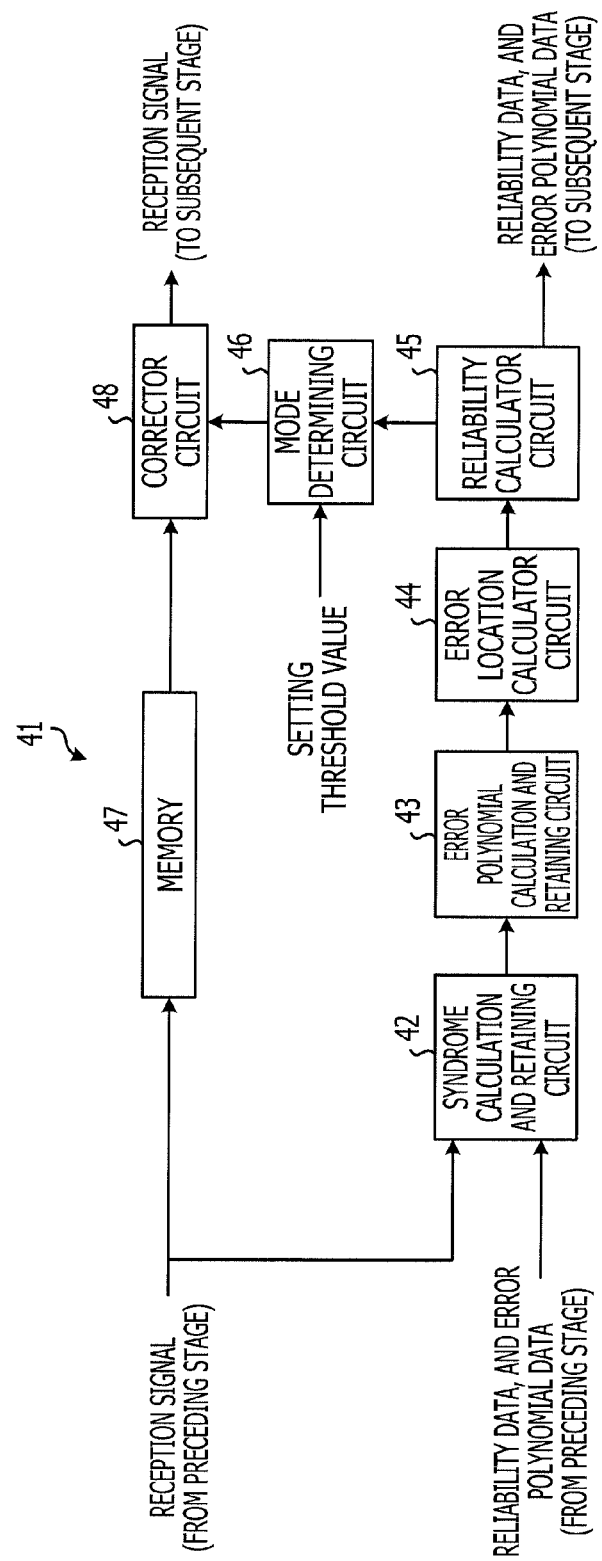
FIG. 5 is a block diagram illustrating an error corrector of the second embodiment.

FIG. 5 is a block diagram illustrating an error corrector 41 of the second embodiment. The error corrector 41 of FIG. 5 is an example of the decoder 33 of FIG. 4. As illustrated in FIG. 5, the error corrector 41 includes syndrome calculation and retaining circuit 42, error polynomial calculation and retaining circuit 43, error location calculator circuit 44, reliability calculator circuit 45 as a calculator circuit, mode determining circuit 46 as a determining circuit, memory 47, and corrector circuit 48.

The syndrome calculation and retaining circuit 42 is coupled to a circuit (not illustrated) at a preceding stage (an error corrector at the preceding stage or the mapper 32 of FIG. 4). The error polynomial calculation and retaining circuit 43 is coupled to the syndrome calculation and retaining circuit 42. The error location calculator circuit 44 is coupled to the error polynomial calculation and retaining circuit 43. The reliability calculator circuit 45 is coupled to the error location calculator circuit 44. The mode determining circuit 46 is coupled to the reliability calculator circuit 45. The mode determining circuit 46 is coupled to the error location calculator circuit 44. The memory 47 is coupled to a circuit (not illustrated) at a preceding stage (an error corrector at the preceding stage or the mapper 32 of FIG. 4). The corrector circuit 48 is coupled to the mode determining circuit 46 and the memory 47. The corrector circuit 48 is also coupled to a circuit (not illustrated) at a subsequent stage (an error corrector at the subsequent stage or the demapper 34 of FIG. 4).

The syndrome calculation and retaining circuit 42 receives a mapped codeword as a reception signal from the preceding stage, and calculates a syndrome of the codeword. The error polynomial calculation and retaining circuit 43 determines a coefficient of the error polynomial in accordance with the calculation results of the syndrome. The error location calculator circuit 44 calculates the root of the error polynomial. More specifically, the error location calculator circuit 44 calculates an error location. The reliability calculator circuit 45 calculates the reliability of the codeword in accordance with the error location. If the error corrector 41 is coupled to an error corrector at a subsequent stage, data of the reliability of the codeword and the error polynomial calculated by the error corrector 41 at the present stage are passed to the error corrector at the subsequent stage. The method of calculating the reliability of the codeword is described below.

The mode determining circuit 46 compares the reliability of the codeword with a preset threshold value, and determines the mode of error correction in accordance with the comparison results. An example of the threshold value is described below. The error correction modes may include three modes. A first mode is "fix" mode in which the error correction process is performed on a codeword that is highly likely correctable. A second mode is a "try" mode in which the error correction process is performed on a slightly unreliable codeword on the assumption that an error correction process is redone by an error corrector at a subsequent stage. A third mode is a "pass" mode in which no error correction process is performed at that point of time because a correction error is likely.

The memory 47 retains the signal received from the preceding stage for a delay caused when the signal is processed through the syndrome calculation and retaining circuit 42 to the mode determining circuit 46. The corrector circuit 48 performs the error correction process in the "fix" mode or the "try" mode. The corrector circuit 48 performs the error correction process by inverting a bit of a signal output from the memory 47 with the bit corresponding to a location of the root calculated by the error location calculator circuit 44.

If the error corrector 41 at the present stage is coupled to an error corrector at the preceding stage, i.e., if the error corrector 41 at the present stage serves as a error corrector at a subsequent stage, the data of the reliability of the codeword and the error polynomial calculated by the error corrector 41 at the preceding stage are output from the error corrector at the preceding stage to the error corrector at the present stage.

In the error corrector 41 at the present stage, the syndrome calculation and retaining circuit 42 and the error polynomial calculation and retaining circuit 43 retain information of the error polynomial and information of the reliability of the codeword passed from the error corrector at the preceding stage. The information of the error polynomial and the information of the reliability of the codeword may be retained in a register, for example.

The error corrector 41 at the subsequent stage may use the information of the error polynomial and the information of the reliability of the codeword passed from the error corrector at the preceding stage. The error corrector 41 may redo the error correction process that the error corrector at the preceding stage has performed in the "try" mode. To determine whether to redo the error correction process, the error corrector 41 may use the information of the error polynomial and the information of the reliability of the codeword output by the error corrector at the preceding stage.

The mode determining circuit 46 compares the reliability of the codeword output by the error corrector at the preceding stage with the preset threshold value, and determines the redo mode of the error correction in accordance with the comparison results. An example of the threshold value is described below. The redo modes of the error correction may include three modes. A first mode is an "undo" mode in which the error correction is redone based on information relating to a correction location output by the error corrector at the preceding stage such that the codeword reverts back to a state prior to the error correction of the error corrector at the preceding stage. A second mode is an "information keep" mode in which the information relating to the correction location output by the error corrector at the preceding stage remains kept with the redo process not performed. A third mode is a "reset" mode in which the information relating to the correction location output by the error corrector at the preceding stage is reset with the redo process not performed.

If the error corrector 41 at the present stage is coupled to the error corrector 41 at the preceding stage, the mode determining circuit 46 at the present stage may determine the error correction mode using the data of the reliability of the codeword output from the error corrector 41 at the preceding stage. The data of the reliability of the codeword calculated by the reliability calculator circuit 45 may be passed to the error corrector 41 at the subsequent stage. In this way, the delay taken when the signal is processed through the syndrome calculation and retaining circuit 42 trough the mode determining circuit 46 in the error corrector 41 is reduced. The error correction process is complete within a short period of time.

Figure 6:
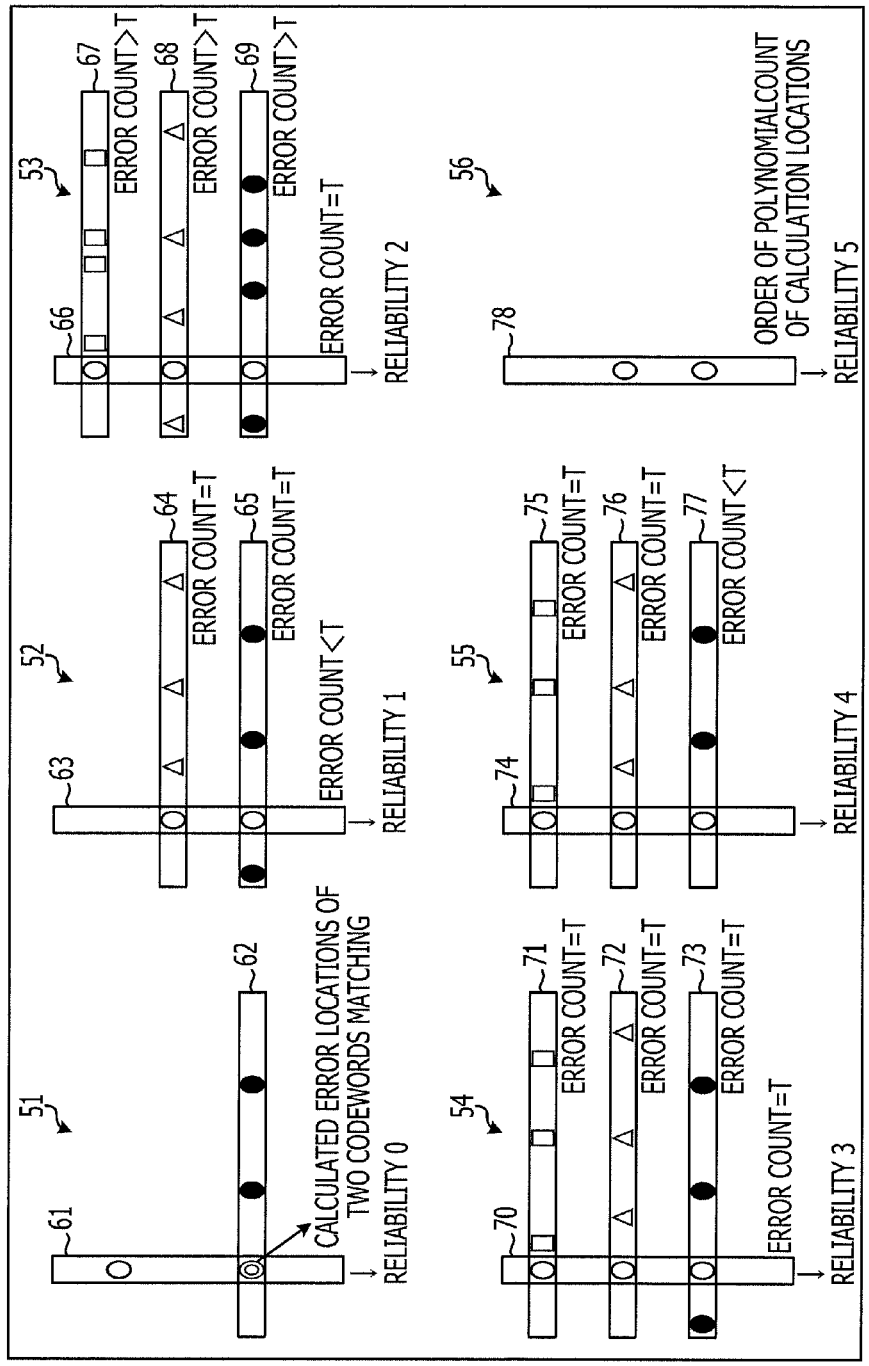
FIG. 6 illustrates a calculation example of reliability of the error correction apparatus of the second embodiment.

FIG. 6 diagrammatically illustrates a calculation example of the reliability of the error correction apparatus 1 of the second embodiment. FIG. 7 is a table listing the calculation examples of the reliability of the error correction apparatus 1 of the second embodiment. The order of the error polynomial is equal to the number of correctable number of bits are equal to each other as in Bose-Chaudhuri-Hocquenghem (BCH) code, and is T at maximum (T is a natural number). In the discussion that follows, the order of the error polynomial of the codeword as a correction target is set to be T (=3) for convenience of explanation. The calculation examples are summarized as illustrated in FIG. 7.

The reliability calculator circuit 45 in the error corrector 41 calculates the reliability of the codeword by combining internal information of each codeword with information resulting from correlation between the codewords. An example of the internal information of each codeword is conformity between the order of the error polynomial and the number of roots of the error polynomial. An example of the information resulting from correlation between the codewords is comparison information of the error polynomials of a first codeword and a second codeword that intersects at the location of the root of the error polynomial of the first codeword.

In an example of a codeword 51 of FIG. 6, the order of the error polynomial of a codeword 61 as a correction target is 2, and is thus equal to or smaller than T (=3). The number of roots of the error polynomial of the codeword 61 as the correction target is 2 (denoted by a blank circle and dual circles), and is thus equal to the order of the error polynomial. Considering a relationship with another codeword, a codeword 62 intersects at the location of the root of the error polynomial of the codeword 61 as the correction target and the correction location of the codeword 62 matches the codeword 61 at the location denoted by the dual circles. The roots of the error polynomial of the codeword 62 are denoted by the dual circles and solid circles. If these conditions are satisfied, the reliability of the codeword 61 as the correction target is zero. The reliability is rated on a six-point scale from 0 to 5. A rating 0 indicates the highest reliability, and a rating 5 indicates the lowest reliability.

In an example of a codeword 52 of FIG. 6, the order of the error polynomial of a codeword 63 as a correction target is 2, and is thus equal to or smaller than T−1 (=2). The number of roots of the error polynomial of the codeword 63 as the correction target is 2 (denoted by two blank circles), and is thus equal to the order of the error polynomial. Considering a relationship with other codewords, codewords 64 and 65 intersect at the locations of the roots of the error polynomial of the codeword 63 as the correction target and do not match the codeword 63 in correction location. The order of the error polynomial of the codeword 64 is 3, and the codeword 64 has the roots of the error polynomial at locations denoted by blank triangles. The order of the error polynomial of the codeword 65 is 3, and has roots of the error polynomial at locations denoted by solid circles. Out of the three codewords 63, 64, and 65, the order of the error polynomial of the codeword 63 is the lowest and only one. If these conditions are satisfied, the reliability of the codeword 63 as the correction target is 1.

In an example of a codeword 53 of FIG. 6, the order of the error polynomial of a codeword 66 as a correction target is 3, and is thus equal to or smaller than T (=3). The number of roots of the error polynomial of the codeword 66 as the correction target is 3 (denoted by three blank circles), and is thus equal to the order of the error polynomial. Considering a relationship with other codewords, codewords 67, 68, and 69 intersect at the locations of the roots of the error polynomial of the codeword 66 as the correction target but do not match the codeword 66 in correction location. The order of the error polynomial of the codeword 67 is 4, and the codeword 67 has the roots of the error polynomial at locations denoted by blank squares. The order of the error polynomial of the codeword 68 is 4, and the codeword 68 has the roots of the error polynomial at locations denoted by blank triangles. The order of the error polynomial of the codeword 69 is 4, and the codeword 69 has the roots of the error polynomial at locations denoted by solid circles. Out of the four codewords 66, 67, 68, and 69, the order of the error polynomial of the codeword 66 as the correction target is the lowest and only one. If these conditions are satisfied, the reliability of the codeword 66 as the correction target is 2.

In an example of a codeword 54 of FIG. 6, the order of the error polynomial of a codeword 70 as a correction target is 3, and is thus equal to or smaller than T (=3). The number of roots of the error polynomial of the codeword 70 as the correction target is 3 (denoted by three blank circles), and is thus equal to the order of the error polynomial. Considering a relationship with other codewords, codewords 71, 72, and 73 intersect at the locations of the roots of the error polynomial of the codeword 70 as the correction target but do not match the codeword 70 in correction location. The order of the error polynomial of the codeword 71 is 3, and the codeword 71 has the roots of the error polynomial at locations denoted by blank squares. The order of the error polynomial of the codeword 72 is 3, and the codeword 72 has the roots of the error polynomial at locations denoted by blank triangles. The order of the error polynomial of the codeword 73 is 3, and the codeword 73 has the roots of the error polynomial at locations denoted by solid circles. Out of the four codewords 70, 71, 72, and 73, the order of the error polynomial of the codeword 70 as the correction target is the lowest. If these conditions are satisfied, the reliability of the codeword 70 as the correction target is 3.

In an example of a codeword 55 of FIG. 6, the order of the error polynomial of a codeword 74 as a correction target is 3, and is thus equal to or smaller than T (=3). The number of roots of the error polynomial of the codeword 74 as the correction target is 3 (denoted by three blank circles), and is thus equal to the order of the error polynomial. Considering a relationship with other codewords, codewords 75, 76, and 77 intersect at the locations of the roots of the error polynomial of the codeword 74 as the correction target but do not match the codeword 74 in correction location. The order of the error polynomial of the codeword 75 is 3, and the codeword 75 has the roots of the error polynomial at locations denoted by blank squares. The order of the error polynomial of the codeword 76 is 3, and the codeword 76 has the roots of the error polynomial at locations denoted by blank triangles. The order of the error polynomial of the codeword 77 is 2, and the codeword 77 has the roots of the error polynomial at locations denoted by solid circles. Out of the four codewords 74, 75, 76, and 77, the order of the error polynomial of the codeword 74 as the correction target is not the lowest. If these conditions are satisfied, the reliability of the codeword 74 as the correction target is 4.

In an example of a codeword 56 of FIG. 6, the order of the error polynomial of a codeword 78 as a correction target is 3, and is thus equal to or smaller than T (=3). The number of roots of the error polynomial of the codeword 78 as the correction target is 2 (denoted by two blank circles), and is not equal to the order of the error polynomial. There is no need to consider a relationship with other codewords. More specifically, if the number of roots of the error polynomial of the codeword 78 as the correction target is not equal to the order of the error polynomial, the reliability of the codeword 78 is automatically 5.

FIG. 8 illustrates an example of the threshold value of the error correction apparatus 1 of the second embodiment. The error correction apparatus 1 includes but is not limited to a six stages of error correctors (decoders). For simplicity of explanation, the "information keep" mode is unused. The threshold value is adjusted to an optimum value taking into consideration desired error correction performance and the number of stages of error correctors.

As illustrated in FIG. 8, if the reliability of the codeword is 0, a error corrector at a first stage is in the "fix" mode. If the reliability of the codeword is 1, the error corrector at the first stage is in the "try" mode. If the reliability of the codeword is 2-5, the error corrector at the first stage is in the "pass" mode. If the reliability of the codeword is 0-1, a stage error corrector at a second stage is in the "fix" mode. If the reliability of the codeword is 2, the error corrector at the second stage is in the "try" mode. If the reliability of the codeword is 3-5, the error corrector at the second stage is in the "pass" mode.

If the reliability of the codeword is 1 in the error corrector at the first stage, the error corrector at the second stage is in the "undo" mode. If the reliability of the codeword is not 1 in the error corrector at the first stage, the error corrector at the second stage is in the "reset" mode. If the reliability of the codeword is 2 in the error corrector at the second stage, an error corrector at a third stage is in the "undo" mode. If the reliability of the codeword is not 2 in the error corrector at the second stage, the error corrector at the third stage is in the "reset" mode.

In each of the error correction mode, and the error correction redo mode, the threshold value level is relaxed as the error correction shifts backward in stage. In this way, the threshold value is set to be severe at a front stage to control the occurrence of a correction error, and then relaxed at a backward stage.

Figure 9:
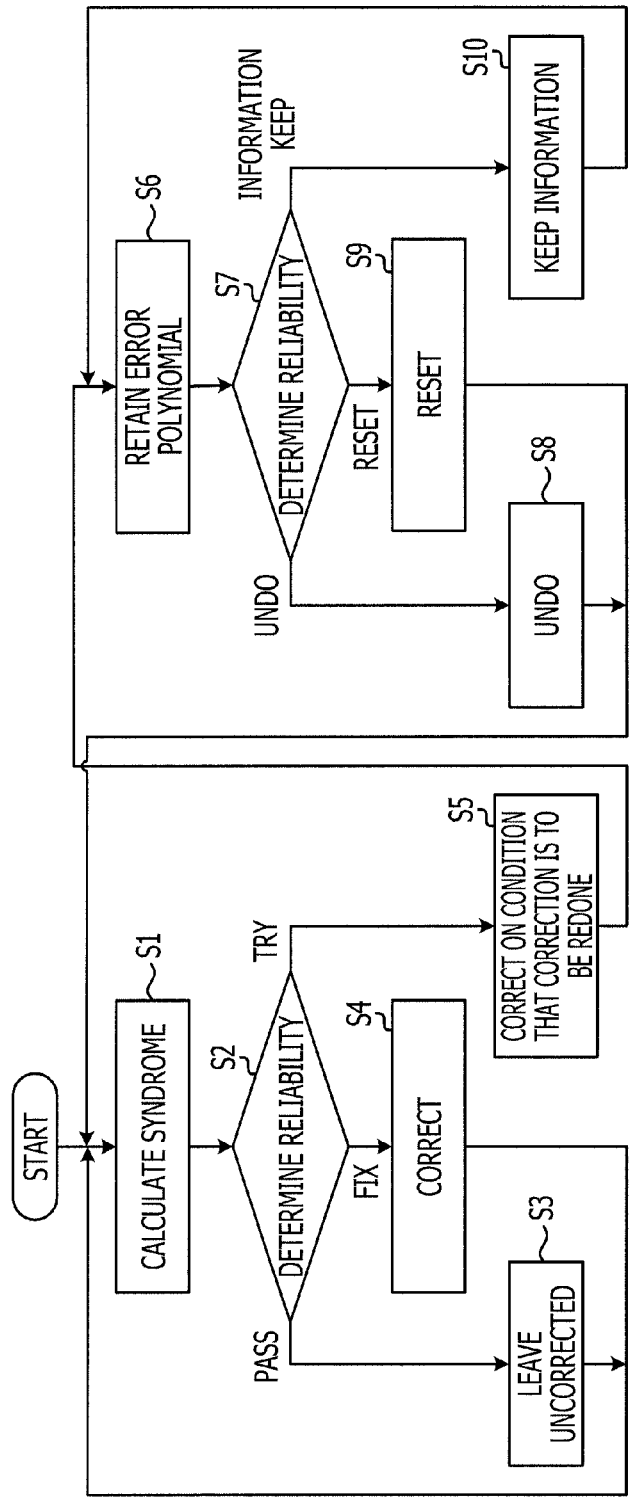
FIG. 9 is a flowchart illustrating an error correction method of the second embodiment.

FIG. 9 is a flowchart illustrating an error correction method of the second embodiment. As illustrated in FIG. 9, the error correction process starts. In the error corrector at the first stage, the syndrome calculation and retaining circuit 42 calculates the syndrome (operation S1). The error polynomial calculation and retaining circuit 43 calculates the coefficient of the error polynomial. The error location calculator circuit 44 calculates the root of the error polynomial. The reliability calculator circuit 45 calculates the reliability of the codeword. The mode determining circuit 46 determines the reliability of the codeword (operation S2), and determines the error correction mode.

If the determination results indicate the "pass" mode, the corrector circuit 48 does not perform the error correction (operation S3). If the determination results indicate the "fix" mode, the corrector circuit 48 performs the error correction (operation S4). In succession to operation S3 or operation S4, the error correction apparatus 1 initializes the error polynomial and then shift to the process at the error corrector at the second stage. As in the error corrector at the first stage, the error correctors at the second stage and subsequent stages start over again with operation S1.

If the error correction mode in the error corrector at the first stage is the "try" mode, the corrector circuit 48 performs the error correction (operation S5). The error corrector passes the error polynomial to the error corrector at the second stage. Processing proceeds to the process of the error corrector at the second stage. The syndrome calculation and retaining circuit 42, the error polynomial calculation and retaining circuit 43, the error location calculator circuit 44, and the reliability calculator circuit 45 included in the error corrector at the second stage retain the error polynomial output by the error corrector at the first stage (operation S6). The mode determining circuit 46 then determines the reliability of the codeword (operation S7), and then determines the error correction redo mode.

If the determination results indicate the "undo" mode, the corrector circuit 48 sets the codeword to the state prior to the error correction of the error corrector at the first stage (operation S8). If the determination results indicate the "reset" mode, the corrector circuit 48 resets information relating to the correction location output by the error corrector at the first stage (operation S9). In succession to operation S8 or operation S9, the error correction apparatus 1 initializes the error polynomial. Proceeding proceeds to the process of the error corrector at the third stage. The error corrector at the third stage starts over with operation S1 as the error corrector at the first stage.

If the error correction redo mode in the error corrector at the second stage is the "information keep" mode, the corrector circuit 48 continuously keeps the information relating to the correction location output by the error corrector at the first stage without redoing the error correction (operation S10). The error corrector passes the error polynomial to the error corrector at the third stage. Processing proceeds to the process of the error corrector at the third stage. The error corrector at the third stage starts over with operation S6 as the error corrector at the second stage.

If the error correction mode in the error corrector at the preceding stage is the "pass" mode or the "fix" mode in the process of the error corrector at the fourth or subsequent stage, the error polynomial is initialized. Operation S1 and subsequent operations are performed in the error corrector at the present stage. If the error correction mode in the error corrector at the preceding stage is the "try" mode, the error polynomial is passed to the error corrector at the present stage. The error corrector at the present stage performs operation S6 and subsequent operations.

If the error correction redo mode in the error corrector at the preceding stage is the "undo" mode or the "reset" mode in the process of the error corrector at the fourth or subsequent stage, the error polynomial is initialized. Operation S1 and subsequent operations are performed in the error corrector at the present stage. If the error correction redo mode in the error corrector at the preceding stage is the "information keep" mode, the error polynomial is passed to the error corrector at the present stage. The error corrector at the present stage performs operation S6 and subsequent operations.

The series of operations illustrated in FIG. 9 are complete when one of operations S3, S4, S8, S9, and S10 ends.

The second embodiment provides the same advantages as the first embodiment. Since the reliability of the codeword is determined by combining the internal information of each codeword with the information resulting from correlation between the codewords, the accuracy of the reliability is increased. Since the error correction mode is determined by referring to the reliability of the codeword, the occurrence of the correction error is controlled. The error correction performed in the error corrector at the preceding stage is redone by the error corrector at the subsequent stage. Even if a correction error occurs in the error corrector at the preceding stage, that correction error is recovered. Since it is thus expected that the correction error is recovered to some extent, the threshold value level in the error correction mode determination may be relaxed. The number of iteration of error corrections is thus reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An error correction apparatus including a plurality of error correction circuits connected in series, each of the plurality of error correction circuits comprising:
   a calculator circuit that calculates a reliability of a codeword indicating a probability of occurrence of correction errors of the codeword;
   a determination circuit that compares the reliability calculated by the calculator circuit with a threshold value, and determines in accordance with comparison results whether an error correction circuit at a present stage among the plurality of error correction circuits is to correct the codeword; and a corrector circuit that corrects the codeword in accordance with determination results of the determination circuit, wherein each of the error correction circuits correct the codeword when the determination results of the determining circuit indicate that the error correction circuit at the present stage is to correct the codeword, the determination circuit in an error correction circuit at a subsequent stage among the plurality of error correction circuits determines whether the error correcting circuit at the subsequent stage is to correct the codeword when the determination results of the determination circuit indicate that the error correction circuit at the present stage is not to correct the codeword, wherein the calculator circuit calculates the reliability of the codeword in accordance with information of an order of an error polynomial of the codeword and a number of roots of the error polynomial, and information of a correlation relationship between the codeword as a correction target and another codeword that intersect the correction target codeword at a correction location of the codeword as the correction target, the determination circuit in each of the plurality of error correction circuits determines whether to redo the correction of the codeword corrected by an error correction circuit at a preceding stage among the plurality of error correction circuits in accordance with the comparison results, and the corrector circuit redoes the correction of the codeword in accordance with the determination results, and the determination circuit in each of the plurality of error correction circuits determines whether to redo the correction of the codeword corrected by the error corrector at the preceding stage in accordance with information of the error polynomial and the information of the reliability of the codeword transmitted from the error corrector at the preceding stage.

2. The error correction apparatus according to claim 1, wherein the determination circuit determines whether to redo the correction of the codeword corrected by an error correction circuit at a preceding stage in accordance with the comparison results of the reliability of the codeword with the threshold value, and wherein the error correction circuit redoes the correction of the codeword in accordance with the determination results.

3. An error correction method by an error correction apparatus including a plurality of error correction circuits connected in series, the error correction method comprising:

calculating, by an error correction circuit at a present stage among the plurality of error correction circuits, a reliability of a codeword indicating a probability of occurrence of correction errors of the codeword;

comparing, by the error correction circuit, the reliability with a threshold value;

determining, by the error correction circuit at the present stage, in accordance with comparison results acquired by the comparing whether the error correction circuit is to correct the codeword;

correcting, by the error correction circuit at the present stage, the codeword when the determination results indicate that the error correction circuit at the present stage is to correct the codeword;

determining, by an error correction circuit at a subsequent stage among the plurality of correction circuits, whether the error correction circuit at the subsequent stage is to correct the codeword when the determination results indicate that the error correction circuit at the present stage is not to correct the codeword, wherein the calculating includes calculating the reliability of the codeword in accordance with information of an order of an error polynomial of the codeword and a number of roots of the error polynomial, and information of a correlation relationship between the codeword as a correction target and another codeword that intersect the correction target codeword at a correction location of the codeword as the correction target, the determining by the error correction circuit at the present stage includes determining whether to redo the correction of the codeword corrected at a preceding stage in accordance with the comparison results, and the correcting includes redoing the correction of the codeword in accordance with the determination results, and wherein the determining by the error correction circuit at the present stage includes determining whether to redo the correction of the codeword corrected at the preceding stage in accordance with information of an error polynomial and the information of the reliability of the codeword transmitted from the preceding stage.

4. The error correction method according to claim 3, wherein the determining includes determining whether to redo the correction of the codeword corrected at the preceding stage in accordance with the comparison results of the reliability of the codeword with the threshold value, and wherein the correcting includes redoing the correction of the codeword in accordance with the determination results.

* * * * *

UNITED STATES PATENT AND TRADEMARK OFFICE
CERTIFICATE OF CORRECTION

PATENT NO.         : 8,839,070 B2                                             Page 1 of 1
APPLICATION NO.    : 13/404363
DATED              : September 16, 2014
INVENTOR(S)        : Koganei It is certified that error appears in the above-identified patent and that said Letters Patent is hereby corrected as shown below:

In the Claims

Column 11, Line 7-8, In Claim 1, Delete "determining" and insert -- determination --, therefor.

Column 11, Line 35, In Claim 1, Delete "corrector" and insert -- correction circuit --, therefor.

Column 11, Line 38, In Claim 1, Delete "corrector" and insert -- correction circuit --, therefor.

Signed and Sealed this
Sixth Day of January, 2015

Michelle K. Lee
*Deputy Director of the United States Patent and Trademark Office*